United States Patent
Sato

(10) Patent No.: US 9,283,639 B2
(45) Date of Patent: Mar. 15, 2016

(54) LASER DICING METHOD

(71) Applicant: Toshiba Kikai Kabushiki Kaisha, Tokyo (JP)

(72) Inventor: Shoichi Sato, Shizuoka (JP)

(73) Assignee: Toshiba Kikai Kabushiki Kaisha, Chiyoda-ku, Tokyo (JP)

( * ) Notice: Subject to any disclaimer, the term of this patent is extended or adjusted under 35 U.S.C. 154(b) by 430 days.

(21) Appl. No.: 13/936,022

(22) Filed: Jul. 5, 2013

(65) Prior Publication Data

US 2014/0008338 A1  Jan. 9, 2014

(30) Foreign Application Priority Data

Jul. 6, 2012  (JP) .................................. 2012-152237

(51) Int. Cl.
*B23K 26/364* (2014.01)
*H01L 33/00* (2010.01)
*B23K 26/36* (2014.01)
*B23K 26/00* (2014.01)
(Continued)

(52) U.S. Cl.
CPC ........... *B23K 26/367* (2013.01); *B23K 26/0057* (2013.01); *B23K 26/364* (2015.10); *B23K 26/40* (2013.01); *C03C 23/0005* (2013.01); *H01L 33/00* (2013.01); *B23K 2203/50* (2015.10); *C03C 23/0025* (2013.01)

(58) Field of Classification Search
CPC ........ B23K 26/36; B23K 26/02; B23K 26/08; B23K 26/38; B23K 26/40
USPC ............. 219/121.61, 121.62, 121.68, 121.69, 219/121.85; 438/33, 68, 113, 114, 460, 462
See application file for complete search history.

(56) References Cited

U.S. PATENT DOCUMENTS 5,990,444 A * 11/1999 Costin ................... B23K 26/03
                                                 219/121.61
9,050,683 B2 * 6/2015 Sato .................... B23K 26/0057
(Continued)

FOREIGN PATENT DOCUMENTS

JP  2005246450 A  *  9/2005
JP  3867107        10/2006
(Continued)

OTHER PUBLICATIONS

Korean Office Action issued in 10-2013-0078704 on Jul. 14, 2014 with an English Language Translation.
(Continued)

*Primary Examiner* — Samuel M Heinrich
(74) *Attorney, Agent, or Firm* — DLA Piper LLP (US)

(57) ABSTRACT

A laser dicing method is a laser dicing method which includes: switching irradiation and non-irradiation of the pulse laser beam on the work piece in light pulse units by controlling passing and blocking of the pulse laser beam using a pulse picker in synchronization with the clock signal; and forming a crack reaching a substrate surface of the work piece to be continuous in the substrate surface of the work piece, and which includes: a first crack forming step of irradiating the pulse laser beam on the work piece along a first line; and a second crack forming step of irradiating the pulse laser beam on the work piece along a second line orthogonal to the first line, and in which, in an area in which the first line and the second line cross, a light pulse density of the pulse laser beam is increased in the first crack forming step or the second crack forming step.

16 Claims, 14 Drawing Sheets

(51) Int. Cl.
  *B23K 26/40* (2014.01)
  *C03C 23/00* (2006.01)

(56) References Cited

U.S. PATENT DOCUMENTS

| 2011/0095006 A1 | 4/2011 | Hayashi |
| 2011/0318877 A1 | 12/2011 | Akiyama |

FOREIGN PATENT DOCUMENTS

| JP | 2008-198905 | 8/2008 |
| JP | 2011-240383 | 1/2011 |
| JP | 2011-091322 | 5/2011 |
| JP | 2012-006039 | 1/2012 |
| JP | 2012-006040 | 1/2012 |
| JP | 2012-028734 | 2/2012 |
| JP | 2013-027887 | 2/2013 |
| JP | 2013-046924 | 3/2013 |
| JP | 2013-048207 | 3/2013 |
| JP | 2013-048244 | 3/2013 |
| JP | 2013-091074 | 5/2013 |
| JP | 2013-121603 | 6/2013 |
| JP | 2013-121604 | 6/2013 |
| JP | 2013-121605 | 6/2013 |
| JP | 2014-011358 | 1/2014 |

OTHER PUBLICATIONS

U.S. Appl. No. 12/911,277 electronically captured Mar. 11, 2015.
Related U.S. Appl. No. 13/556,668 electronically captured on Mar. 11, 2015.
U.S. Appl. No. 13/929,472 electronically captured Mar. 11, 2015.
Chinese Office Action issue din CN 201310280698.2 on Dec. 4, 2014 with English Translation.
Related U.S. Appl. No. 12/911,277 electronically captured on Jul. 16, 2015.
Related U.S. Appl. No. 13/556,668 electronically captured on Jul. 16, 2015.
Related U.S. Appl. No. 13/929,472 electronically captured on Jul. 16, 2015.
U.S. Appl. No. 13/008,382 electronically captured Nov. 14, 2014.
U.S. Appl. No. 13/159,192 electronically captured Nov. 14, 2014.
U.S. Appl. No. 12/911,277 electronically captured Nov. 14, 2014.
Related U.S. Appl. No. 13/556,641 electronically captured on Nov. 14, 2014.
Related U.S. Appl. No. 13/556,618 electronically captured on Nov. 14, 2014.
Related U.S. Appl. No. 13/556,668 electronically captured on Nov. 14, 2014.
English Language Abstract of JP 2011-091322 published May 6, 2011.
English Language Translation of JP 2011-091322 published May 6, 2011.
English Language Translation of JP 2012-028734 published Feb. 9, 2012.
U.S. Appl. No. 13/929,472 electronically captured Nov. 14, 2014.
English Language Abstract of JP 2011-240383 published Dec. 1, 2011.
English Language Translation of JP 2011-240383 published Dec. 1, 2011.
English Language Abstract of JP 2012-006040 published Dec. 1, 2012.
English Language Translation of JP 2012-006040 published Dec. 1, 2012.
English Language Abstract of JP 2012-006039 published Dec. 1, 2012.
English Language Translation of JP 2012-006039 published Dec. 1, 2012.
English Language Abstract of JP 2013-091074 published May 16, 2013.
English Language Translation of JP 2013-091074 published May 16, 2013.
English Language Abstract of JP 2013-048244 published Jul. 3, 2013.
English Language Translation of JP 2013-048244 published Jul. 3, 2013.
English Language Abstract and Translation of JP 2013-121603 published Jun. 20, 2013.
English Language Abstract and Translation of JP 2013-121604 published Jun. 20, 2013.
English Language Abstract and Translation of JP2013-121605 published Jun. 20, 2013.
English Language Abstract and Translation of JP2013-027887 published Feb. 7, 2013.
English Language Abstract and Translation of JP2013-048207 published Mar. 7, 2013.
English Language Abstract and Translation of JP2013-046924 published Mar. 7, 2013.
English Language Abstract and Translation of JP2014-011358.
Japanese Office Action issued in JP 2012-152237 dated Apr. 22, 2014.
English Language Translation of Japanese Office Action issued in JP 2012-152237 dated Apr. 22, 2014.
English Language Abstract and Translation of JP 2008-198905 published Aug. 28, 2008.
Related U.S. Appl. No. 14/466,755.

\* cited by examiner

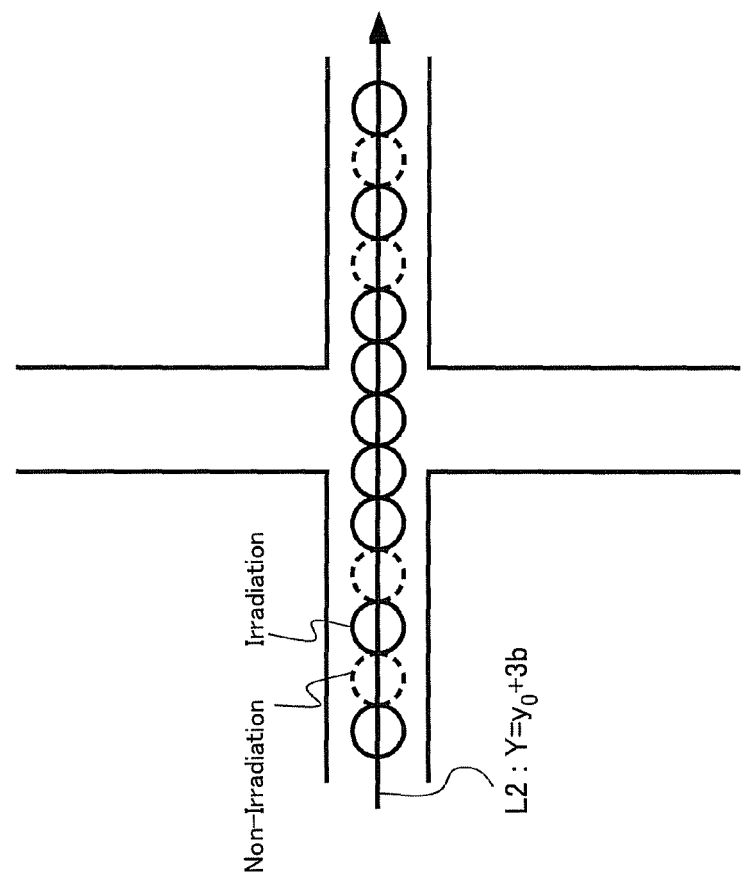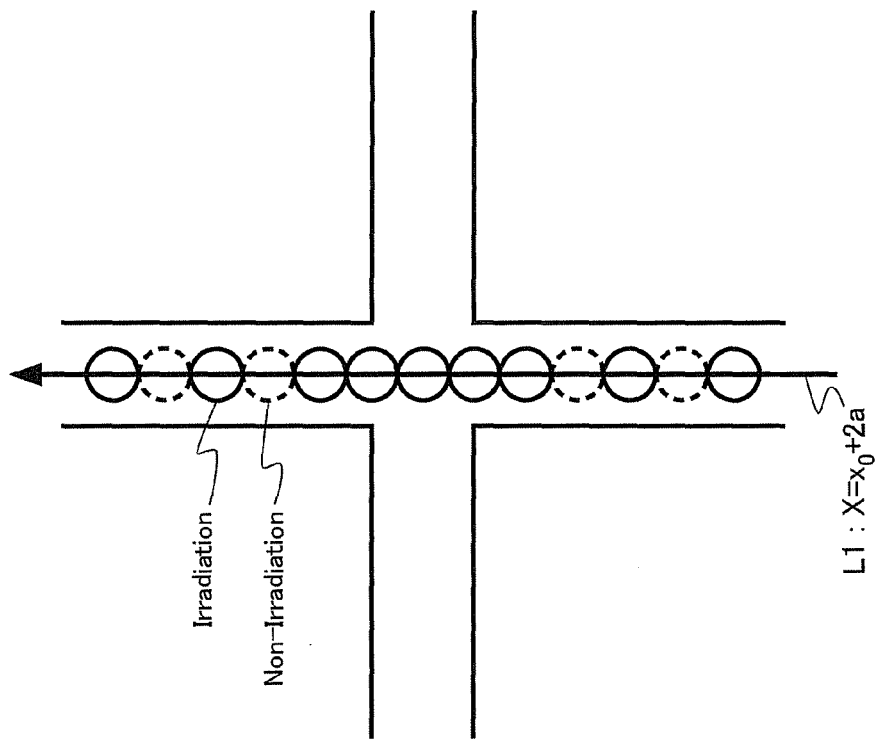

LASER DICING METHOD

CROSS-REFERENCE TO RELATED APPLICATION

This application is based on and claims priority of Japanese Patent Application (JPA) No. 2012-152237, filed on Jul. 6, 2012, the entire contents of which are incorporated herein by reference.

FIELD OF THE INVENTION

An embodiment described herein relates generally to a laser dicing method using a pulse laser beam.

BACKGROUND OF THE INVENTION

Japanese Patent No. 3867107 discloses a method of using a pulse laser beam for dicing of a semiconductor substrate. This method of Japanese Patent No. 3867107 forms an altered region inside a work piece by means of an optical damage produced by a pulse laser beam. Further, the work piece is cut based on this altered region.

According to a conventional technique, formation of the altered region is controlled using, for example, energy of a pulse laser beam, a spot diameter and a relative movement speed of the pulse laser beam and a work piece as parameters.

Dicing is required to provide high linearity at a cut portion. When, for example, a cut portion is cut only into a zig-zag shape, dicing influences semiconductor devices formed on a work piece, and device performance deteriorates and wide widths of dicing lines need to be secured, and therefore there is a problem that the number of devices which can be formed on a substrate decreases.

SUMMARY OF THE INVENTION

A laser dicing method according to one aspect of the present disclosure is a laser dicing method which includes: setting a work piece on a stage; generating a clock signal; emitting a pulse laser beam synchronized with the clock signal; relatively moving the work piece and the pulse laser beam; switching irradiation and non-irradiation of the pulse laser beam on the work piece in light pulse units by controlling passing and blocking of the pulse laser beam using a pulse picker in synchronization with the clock signal; and forming a crack reaching a substrate surface of the work piece to be continuous in the substrate surface of the work piece by controlling irradiation energy of the pulse laser beam, a process point depth of the pulse laser beam and lengths of an irradiation area and a non-irradiation area of the pulse laser beam, and which includes: a first crack forming step of irradiating the pulse laser beam on the work piece along a first line; and a second crack forming step of irradiating the pulse laser beam on the work piece along a second line orthogonal to the first line, and in which, in an area in which the first line and the second line cross, a light pulse density of the pulse laser beam is increased in the first crack forming step or the second crack forming step.

In the method according to the above aspect, preferably, in the first or second crack forming step, a irradiation control signal which includes information of a portion at which the light pulse density of the pulse laser beam is increased is generated, and the light pulse density in an area in which the first line and the second line cross is increased using the irradiation control signal.

In the method according to the above aspect, preferably, the crack is formed substantially linearly in the substrate surface of the work piece.

In the method according to the above aspect, preferably, a position of the work piece and an operation start position of the pulse picker are synchronized.

In the method according to the above aspect, preferably, the work piece includes a sapphire substrate, a quartz substrate or a glass substrate.

The present disclosure can provide a laser dicing method of realizing good cutting performance by optimizing an irradiation condition of a pulse laser beam.

BRIEF DESCRIPTION OF THE DRAWINGS

FIGS. 6A and 6B are explanatory views of the laser dicing method according to the embodiment;

DETAILED DESCRIPTION OF THE INVENTION

Figure 1:
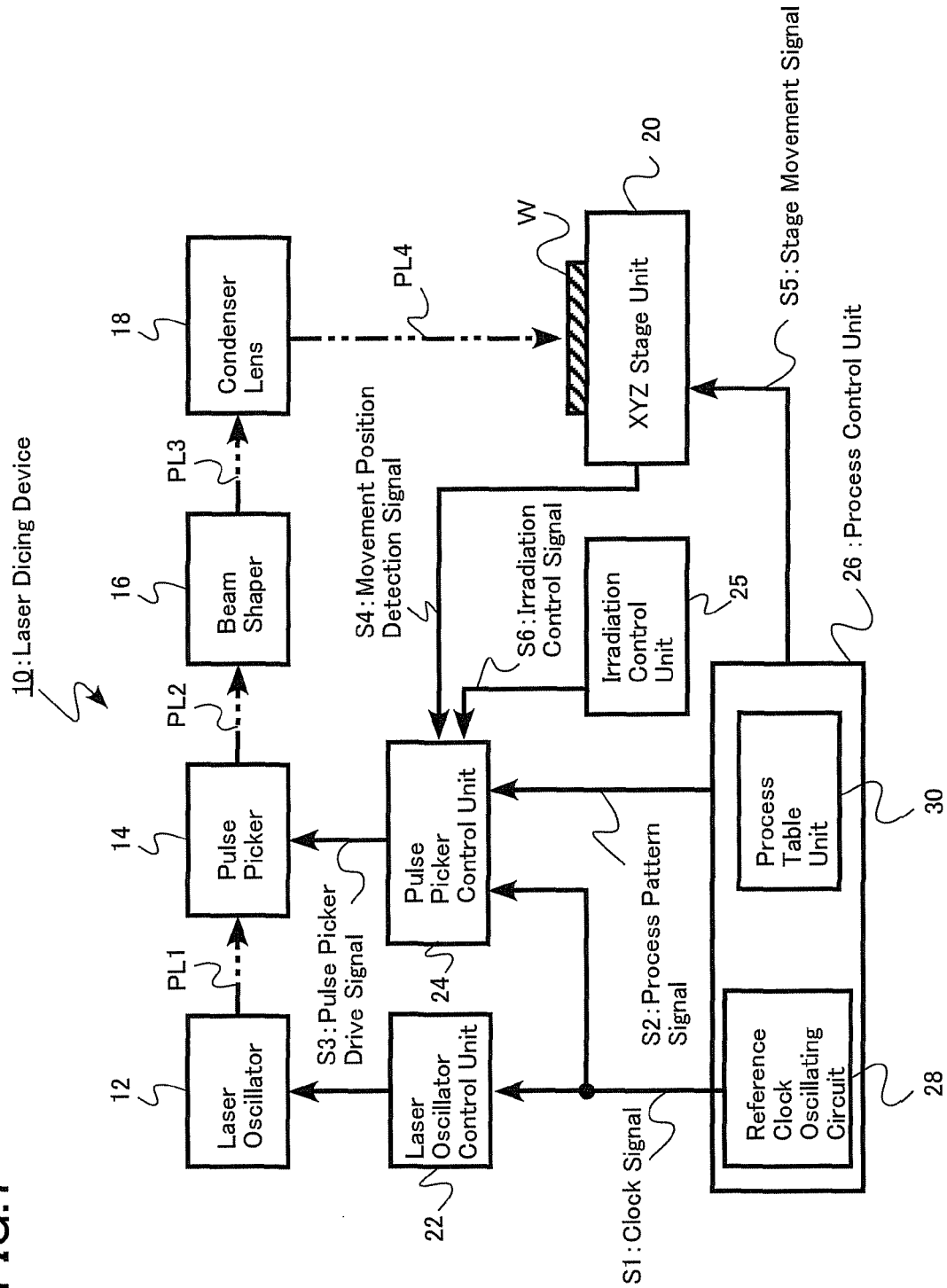
FIG. 1 is a schematic configuration diagram illustrating an example of a laser dicing device used in a laser dicing method according to an embodiment.

Hereinafter, an embodiment of the present disclosure will be described with reference to the drawings. In addition, in this description, a process point is a point near a light condensing position (focus position) in a work piece of a pulse laser beam, and means a point at which the degree of alteration of the work piece maximizes in a depth direction. Further, a process point depth means a depth from a work piece surface of a process point of a pulse laser beam.

Furthermore, in this description, a light pulse density means the density of an irradiation light pulse number on a scan line when irradiation and non-irradiation of a pulse laser beam are repeated in light pulse units.

A laser dicing method according to an embodiment is a laser dicing method which includes: setting a work piece on a stage; generating a clock signal; emitting a pulse laser beam synchronized with the clock signal; relatively moving the work piece and the pulse laser beam; switching irradiation and non-irradiation of the pulse laser beam on the work piece in light pulse units by controlling passing and blocking of the pulse laser beam using a pulse picker in synchronization with the clock signal; and forming a crack reaching a substrate surface of the work piece to be continuous in the substrate surface of the work piece by controlling irradiation energy of the pulse laser beam, a process point depth of the pulse laser beam and lengths of a irradiation area and a non-irradiation area of the pulse laser beam. Further, the laser dicing method includes: a first crack forming step of irradiating the pulse laser beam on the work piece along a first line; and a second crack forming step of irradiating the pulse laser beam on the work piece along a second line orthogonal to the first line. Furthermore, in an area in which the first line and the second line cross, a light pulse density of the pulse laser beam is increased in the first crack forming step and/or the second crack forming step.

According to the configuration, it is possible to provide a laser dicing method which realizes good cutting performance for a work piece. Meanwhile, the good cutting performance includes, for example, (1) a cut portion is cut with good linearity, (2) procedure is simple and (3) cutting can be performed with a low cutting force such that a packing density of diced devices improves. Particularly, at a cross point of dicing lines of devices formed on a work piece, that is, in an area in which scans of pulse laser beams cross, it is possible to prevent, for example, a cut portion of a zig-zag shape of poor linearity from being generated.

Further, by forming a crack which is continuous in a work piece surface, dicing a hard substrate like a sapphire substrate in particular becomes easy. Furthermore, dicing is realized with a narrow dicing width.

A laser dicing device according to the embodiment which realizes the laser dicing method has: a stage on which a work piece can be set; a reference clock oscillating circuit which generates a clock signal; a laser oscillator which emits a pulse laser beam; a laser oscillator control unit which synchronizes the pulse laser beam with the clock signal; a pulse picker which is provided on an optical path between the laser oscillator and the stage, and which switches irradiation and non-irradiation of the pulse laser beam on the work piece; and a pulse picker control unit which controls passing and blocking of the pulse laser beam in the pulse picker in light pulse units in synchronization with the clock signal.

FIG. 1 is a schematic configuration diagram illustrating an example of the laser dicing device according to the embodiment. As illustrated in FIG. 1, a laser dicing device 10 according to the embodiment has as main components a laser oscillator 12, a pulse picker 14, a beam shaper 16, a condenser lens 18, an XYZ stage unit 20, a laser oscillator control unit 22, a pulse picker control unit 24, a irradiation control unit 25 and a process control unit 26. The process control unit 26 has a reference clock oscillating circuit 28 which generates a desired clock signal S1, and a process table unit 30.

The laser oscillator 12 is configured to emit a pulse laser beam PL1 of a cycle Tc synchronized with the clock signal S1 generated by the reference clock oscillating circuit 28. The intensity of radiated pulse light indicates a Gaussian distribution. The clock signal S1 is a process control clock signal used to control laser dicing process.

Meanwhile, a laser wavelength emitted from the laser oscillator 12 uses a transmissive wavelength with respect to a work piece. For a laser, for example, an Nd:YAG laser, an Nd:YVO$_4$ laser or an Nd:YLF laser can be used.

The pulse picker 14 is provided on an optical path between the laser oscillator 12 and the condenser lens 18. Further, the pulse picker is configured to switch irradiation and non-irradiation of the pulse laser beam PL1 on the work piece in light pulse number units by switching passing and blocking (on/off) of the pulse laser beam PL1 in synchronization with the clock signal S1. Thus, on/off of the pulse laser beam PL1 is controlled for process of the work piece by the operation of the pulse picker 14, and becomes a modulated pulse laser beam PL2.

The pulse picker 14 is preferably formed with, for example, an acousto-optic element (AOM). Further, a Raman diffraction electro-optic element (EOM) may also be used.

The beam shaper 16 shapes the incident pulse laser beam PL2 into a pulse laser beam PL3 of a desired shape. The beam shaper is, for example, a beam expander which expands a beam diameter at a fixed magnifying power. Further, for example, an optical element such as a homogenizer which makes a light intensity distribution of a beam cross section uniform may be provided. Furthermore, for example, an element which shapes a beam cross section into a circular shape or an optical element which converts a beam into circular polarized light may also be provided.

The condenser lens 18 condenses the pulse laser beam PL3 shaped by the beam shaper 16, and radiates a pulse laser beam PL4 on a work piece W set on the XYZ stage unit 20 such as a sapphire substrate on which LEDs are formed.

The XYZ stage unit 20 has an XYZ stage (hereinafter, simply referred to as a stage) on which the work piece W can be set and which can move in an XYZ direction, a drive mechanism unit and a position sensor which has a laser interferometer which measures a position of the stage. Meanwhile, the XYZ stage is configured to provide precise positioning precision and movement error in a range of submicrons. Further, when moved in the Z direction, the XYZ stage can adjust the focus position of the pulse laser beam with respect to the work piece W, and control the process point depth.

The process control unit 26 controls overall process of the laser dicing device 10. The reference clock oscillating circuit 28 generates the desired clock signal S1. Further, the process table unit 30 stores a process table in which dicing process data is described as light pulse numbers of pulse laser beams.

The irradiation control unit 25 stores information of a light pulse density increase portion to increase a light pulse density of a pulse laser beam at a portion at which irradiation of pulse laser beams is likely to double upon formation of a crack. Further, the irradiation control unit has a function of generating an irradiation control signal (S6) which has information of the light pulse density increase portion of irradiation of a pulse laser beam based on the stored information, and transmitting the irradiation control signal to the pulse picker control unit 24. The information of the light pulse density increase portion is, for example, a cross point of dicing lines or an XY coordinate which specifies a predetermined range including a cross point.

Figure 2:
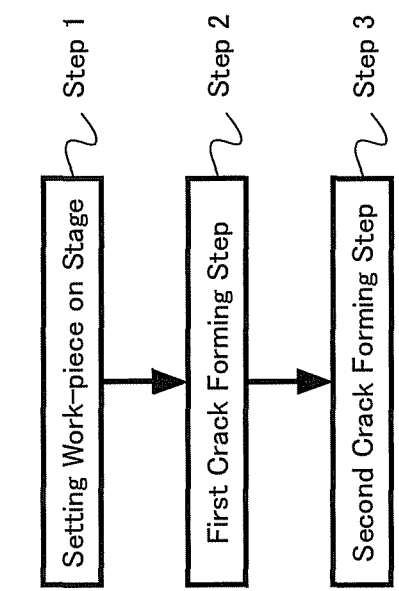
FIG. 2 a procedure flowchart of the laser dicing method according to the embodiment.
Figure 3:
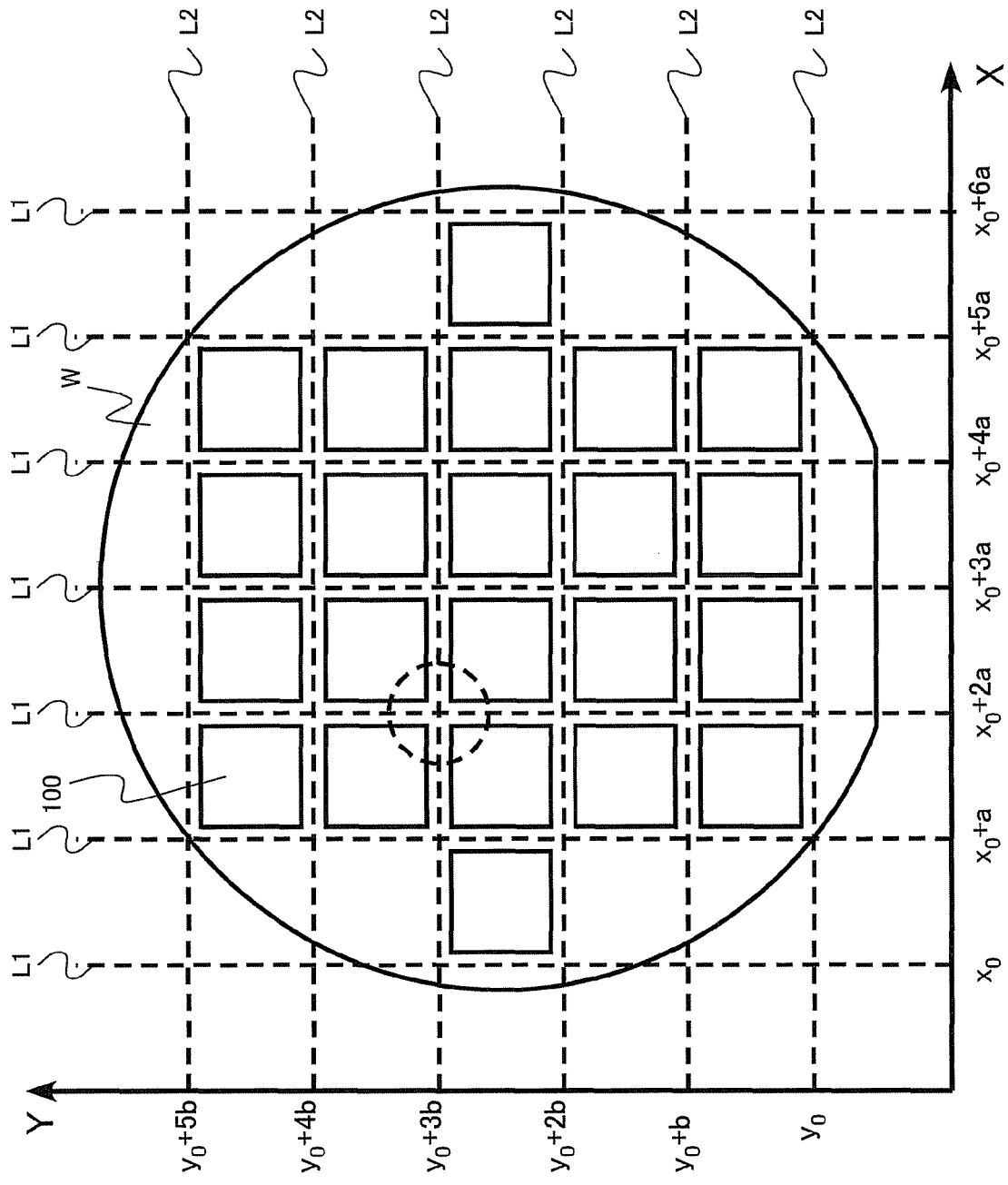
FIG. 3 is an explanatory view of the laser dicing method according to the embodiment.

Next, the laser dicing method using the laser dicing device 10 will be described with reference to the drawings. FIG. 2 a procedure flowchart of the laser dicing method according to the embodiment. FIG. 3 is an explanatory view of the laser dicing method according to the embodiment.

First, a step of setting the work piece W on the XYZ stage unit 20 of the laser dicing device 10 is performed (Step 1). The work piece W is, for example, a wafer on which a plurality of LEDs 100 is formed using an epitaxial semiconductor layer on a sapphire substrate.

As illustrated in FIG. 3, a plurality of LEDs 100 is formed on the work piece W. Between the LEDs 100, there is an area which has a predetermined width to individually divide the LEDs 100, that is, a dicing line. A dicing line width is set to a predetermined width to realize a sufficing packing density of devices according to, for example, capacity of a dicing device and a type of elements.

Figure 4:
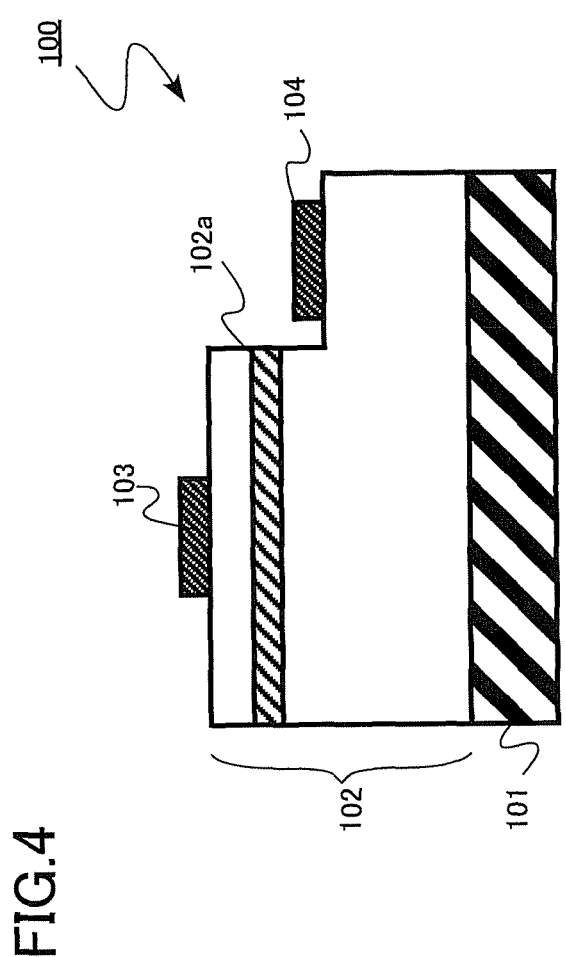
FIG. 4 is a cross-sectional view illustrating an example of a LED according to the embodiment.

FIG. 4 is a cross-sectional view illustrating an example of the LED 100. As illustrated in FIG. 4, the LED 100 has, for example, a sapphire substrate 101, and a GaN semiconductor layer 102 which is formed by, for example, epitaxial growth on the sapphire substrate 101. The semiconductor layer 102 has a light emitting layer 102a. Further, the semiconductor layer has a first electrode 103 and a second electrode 104 which energize the semiconductor layer 102.

In Step 1, the work piece W is set on the XYZ stage unit 20 such that the sapphire substrate 101 of the LEDs 100 becomes a top surface. Meanwhile, a pitch of an arrangement of the LEDs 100 in the X direction is "a", and a pitch in the Y direction is "b".

Next, a first crack forming step of irradiating a pulse laser beam along a first line (L1), and forming a first crack is performed (Step 2). Meanwhile, the first line (L1) means a line along the dicing line vertical to the X direction of the work piece. That is, the first line is a line represented by $X=x_0+(n-1)a$ on the XY coordinate. In addition, n=1 to 7 holds in FIG. 3.

In the first crack forming step, a pulse laser beam is radiated at a rate of irradiation/non-irradiation=1/1.

Next, a second crack forming step of irradiating the pulse laser beam along a second line (L2) orthogonal to the first line (L1), and forming a second crack is performed (Step 3) Meanwhile, the second line (L2) means a line along the dicing line vertical to the Y direction of the work piece. That is, the second line is a line represented by $Y=y_0+(k-1)b$ on the XY coordinate. In addition, k=1 to 6 holds in FIG. 3.

Figure 5B:
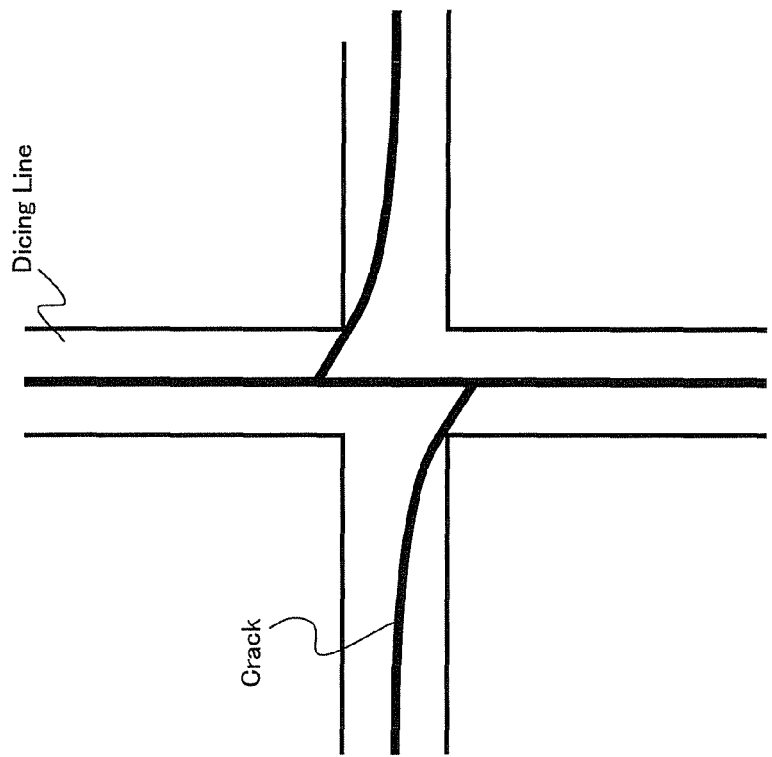
FIGS. 5A and 5B are views for explaining a problem of the laser dicing method.
Figure 5A:
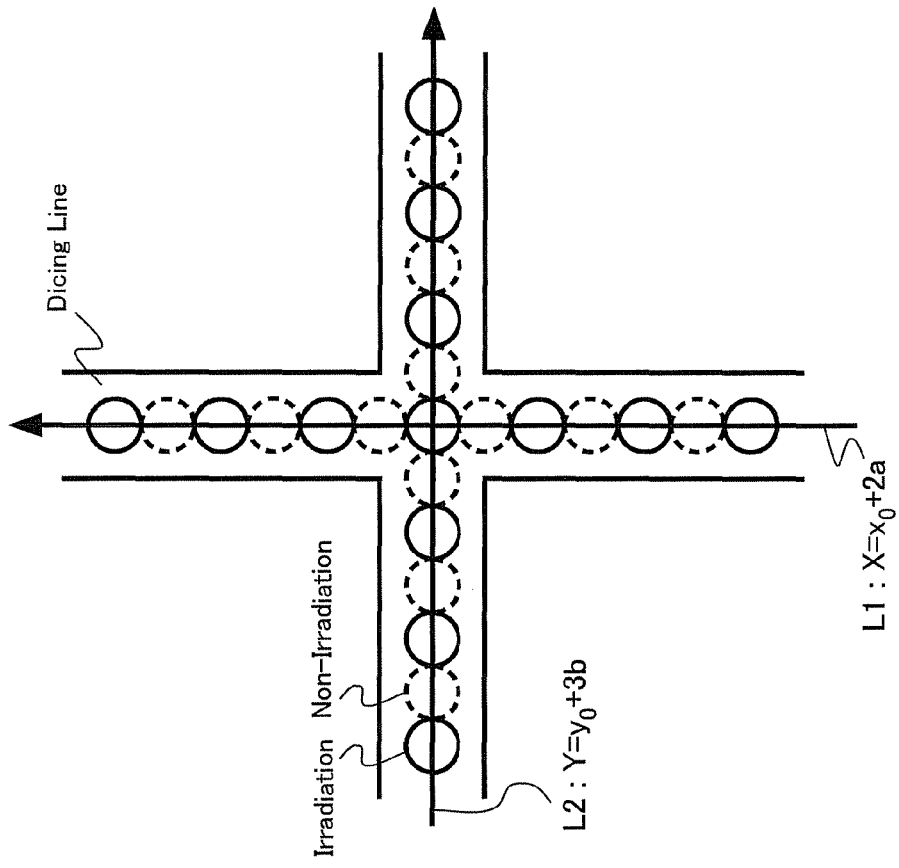

FIGS. 5A and 5B are views for explaining a problem of the laser dicing method. FIG. 5A is a view illustrating an irradiation pattern of a pulse laser beam, and FIG. 5B is a view illustrating a shape of a crack formed according to the irradiation pattern in FIG. 5A. 5A and 5B are both enlarged views of an area encircled by a dotted line circle in FIG. 3. Further, solid line circles in FIG. 5A indicate areas on a surface of the work piece W on which pulse laser beams are radiated. Dotted line circles indicate areas on which a pulse laser beam is not radiated.

As illustrated in FIG. 5A, also in an area in which the first line (L1) and the second line (L2) cross, a pulse laser beam is radiated at a fixed light pulse density similar to the other areas. In this case, as illustrated in FIG. 5B, in the area in which the first line (L1) and the second line (L2) cross, a beam becomes oblique, and a crack has a zig-zag shape in some cases.

The crack is generally formed to connect altered regions formed in a substrate by irradiation of a pulse laser beam. In case of FIG. 5B, when a pulse laser beam is radiated along the second line (L2) in the second crack forming step, in the area in which the first line (L1) and the second line (L2) cross, there has already been an altered region and cracks formed in the first crack forming step. Hence, when, for example, a crystal direction in a direction which is oblique to the first or second line is a direction in which cutting is performed better, cracks oblique to the second line (L2) are formed in the second crack forming step.

When such oblique cracks or zig-zag cracks are formed, for example, there are problems that device performance of, for example, LEDs formed on the work piece W deteriorates, and the packing density of devices decreases. Alternatively, when dicing line widths are set taking into account this zig-zag shape, a problem that the number of devices which can be formed on one work piece W decreases.

In the embodiment, in one or both of the first cracking forming step and the second crack forming step, irradiation of a pulse laser beam is controlled to increase a light pulse density of a pulse laser beam in the area in which the first line (L1) and the second line (L2) cross.

FIGS. 6A and 6B are explanatory views of the laser dicing method according to the embodiment. FIGS. 6A and 6B are both enlarged views of the area encircled by the dotted line circle in FIG. 3. An area is indicated in which the first line (L1) represented by $X=x_0+2a$ and the second line (L2) represented by $Y=y_0+(k-1)b$ cross.

Solid line circles in FIGS. 6A and 6B indicate areas on a surface of the work piece W on which pulse laser beams are radiated. Dotted line circles indicate areas on which a pulse laser beam is not radiated.

As illustrated in, for example, FIG. 6A, in the first crack forming step, in the area in which the first line (L1) and the second line (L2) cross, that is, at a cross point of dicing lines, a light pulse density of a pulse laser beam is increased, and the pulse laser beam is radiated. More specifically, in an area other than the area in which the first line (L1) and the second line (L2) cross, irradiation is performed according to a pattern which includes at least part of the areas which are not radiated as an irradiation area.

Next, as illustrated in, for example, FIG. 6B, in the second crack forming step, in the area in which the first line (L1) and the second line (L2) cross, that is, at a cross point of dicing lines, a light pulse density of a pulse laser beam is increased, and the pulse laser beam is radiated. More specifically, in an area other than the area in which the first line (L1) and the second line (L2) cross, irradiation is performed according to a pattern which includes at least part of the areas which are not radiated as an irradiation area.

Figure 7:
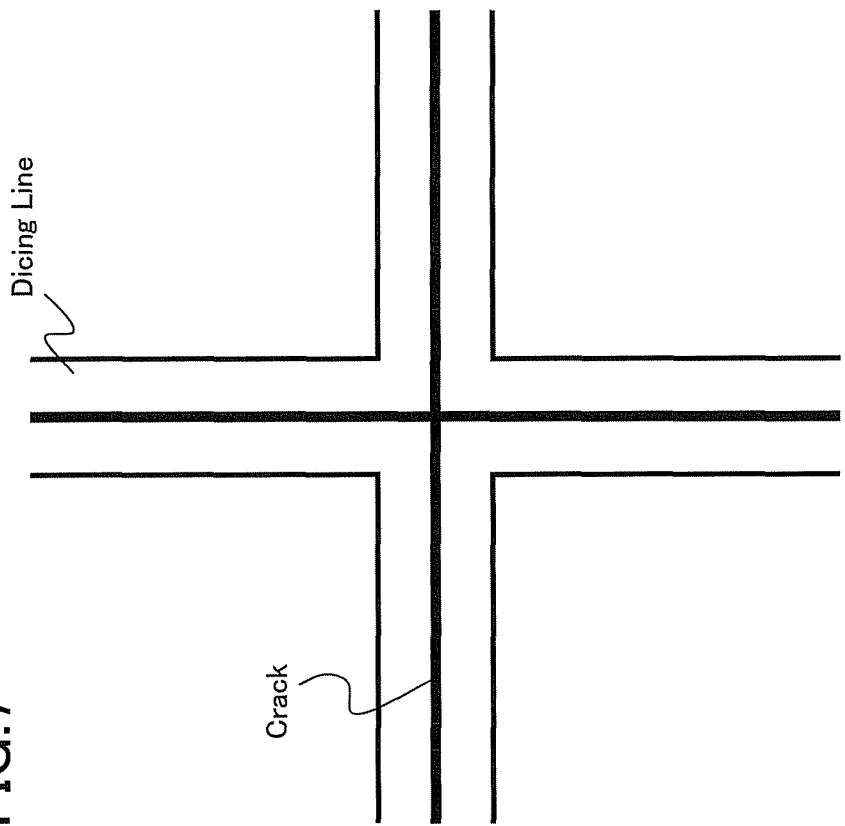
FIG. 7 is a view illustrating a function of the laser dicing method according to the embodiment.

FIG. 7 is a view illustrating a function according to the embodiment. As illustrated in FIG. 7, according to the embodiment, a crack of high linearity is formed after the first and second crack forming steps. Consequently, it is possible to form a cut portion of high linearity. This is because the density of an altered region also becomes high by increasing the light pulse density at a cross point of dicing lines and a crack is produced along the first and second lines, so that a crack oblique to the first or second line is not likely to be produced.

In addition, although a case has been described as an example where a light pulse density of a pulse laser beam is increased at a cross point of dicing lines in both of the first and second crack forming steps, it is also possible to improve linearity of a crack to be formed even in a mode of increasing the light pulse density of a pulse laser beam in one of the crack forming steps.

Particularly in the second crack forming step performed in a state in which a crack has already been produced in the first crack forming step, the light pulse density of a pulse laser beam is preferably increased from a view point of improvement of linearity of the crack. In this case, the light pulse density of the area in which the first line (L1) and the second line (L2) cross is preferably increased in the second crack forming step more than in the first crack forming step.

Next, a basic operation of the first and second crack forming steps (Steps 2 and 3) will be described in detail.

First, a substrate which is the work piece W such as the sapphire substrate on which the LEDs 100 are formed is set on the XYZ stage unit 20. This work piece W is a wafer which has a GaN layer which is formed by epitaxial growth in a lower surface of the sapphire substrate, and on which a plurality of LEDs is formed in this GaN layer. A wafer is positioned with respect to the XYZ stage based on a notch or an orientation flat formed on the wafer.

Figure 8:
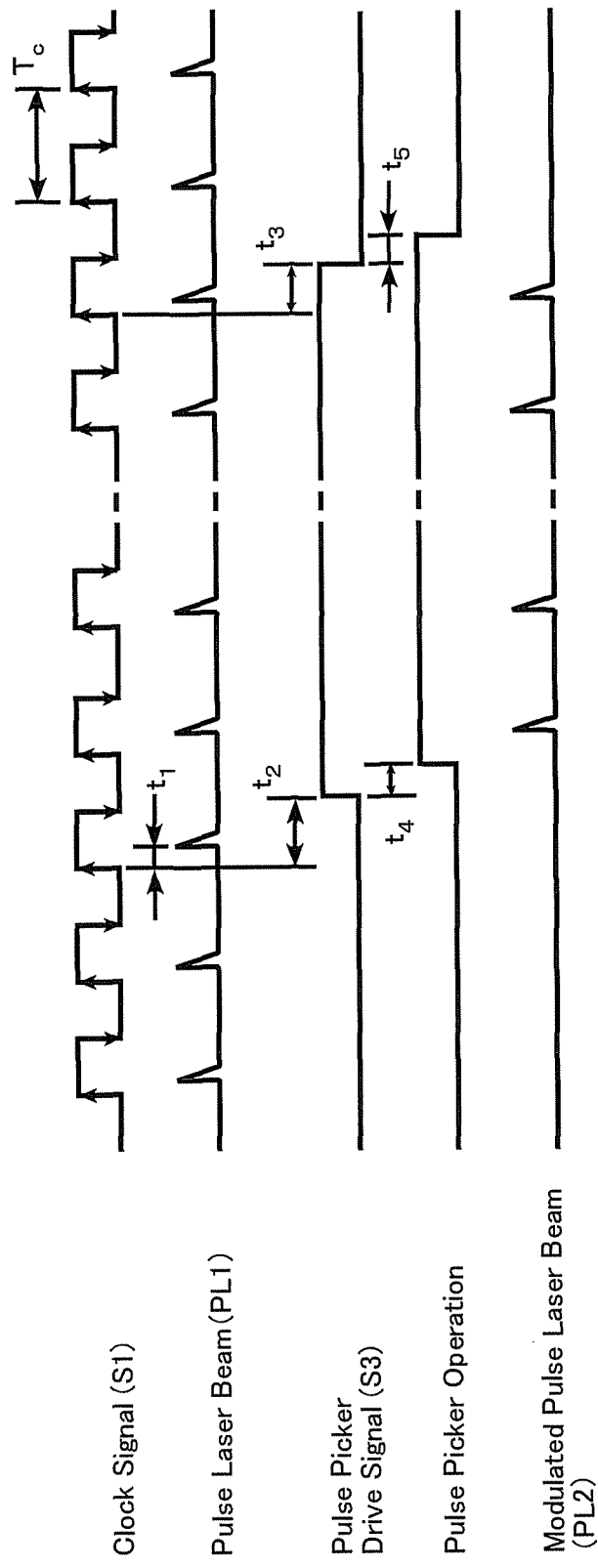
FIG. 8 is a view for explaining timing control of the laser dicing method according to the embodiment.

FIG. 8 is a view for explaining timing control of the laser dicing method according to the embodiment. In the reference clock oscillating circuit 28 of the process control unit 26, the clock signal S1 of the cycle Tc is generated. The laser oscillator control unit 22 controls the laser oscillator 12 to emit the pulse laser beam PL 1 of the cycle Tc synchronized with the clock signal S1. At this time, a delay time $t_1$ is produced upon a rising of the clock signal S1 and a rising of the pulse laser beam.

Laser light having a transmissive wavelength with respect to a work piece is used. In the crack forming step, laser light having greater energy hv of a photon of radiated laser light than a band gap Eg of absorption of a work piece material is preferably used. When the energy hv is much greater than the band gap Eg, laser light is absorbed. This is referred to as multiphoton absorption, and, when a pulse width of laser light is significantly reduced to cause multiphoton absorption inside the work piece, energy of multiphoton absorption is not transformed to thermal energy, a perpetual structure change such as ion valence change, crystallization, amorphization, polarization orientation or fine crack formation is induced and a color center is formed.

For the irradiation energy (irradiation power) of this laser light (pulse laser beam), preferably, optimal conditions for forming continuous cracks in the work piece surface are selected in the first and second crack forming step.

Further, when the transmissive wavelength is used for the work piece material in the first and second crack forming steps, laser light is guided and condensed near the focus inside the substrate. Consequently, the color center can be locally formed. This color center is also referred to as an "altered region" below.

The pulse picker control unit 24 refers to a process pattern signal S2 outputted from the process control unit 26, and generates a pulse picker drive signal S3 synchronized with the clock signal S1. The process pattern signal S2 is stored in the process pattern unit 30, and is generated referring to the process table in which information of the irradiation patterns is described as light pulse numbers in the light pulse units. The pulse picker 14 performs an operation of switching passing and blocking (on/off) of the pulse laser beam PL1 in synchronization with the clock signal S1 based on the pulse picker drive signal S3.

According to this operation of the pulse picker 14, the modulated pulse laser beam PL2 is generated. In addition, delay times $t_2$ and $t_3$ are produced upon a rising of the clock signal S1 and a rising and a falling of the pulse laser beam. Further, delay times $t_4$ and $t_5$ are produced upon a rising and a falling of the pulse laser beam and the pulse picker operation.

Upon process of the work piece, a generation timing of the pulse picker drive signal S3 and a relative movement timing of the work piece and the pulse laser beam are determined taking the delay times $t_1$ to $t_5$ into account.

Figure 9:
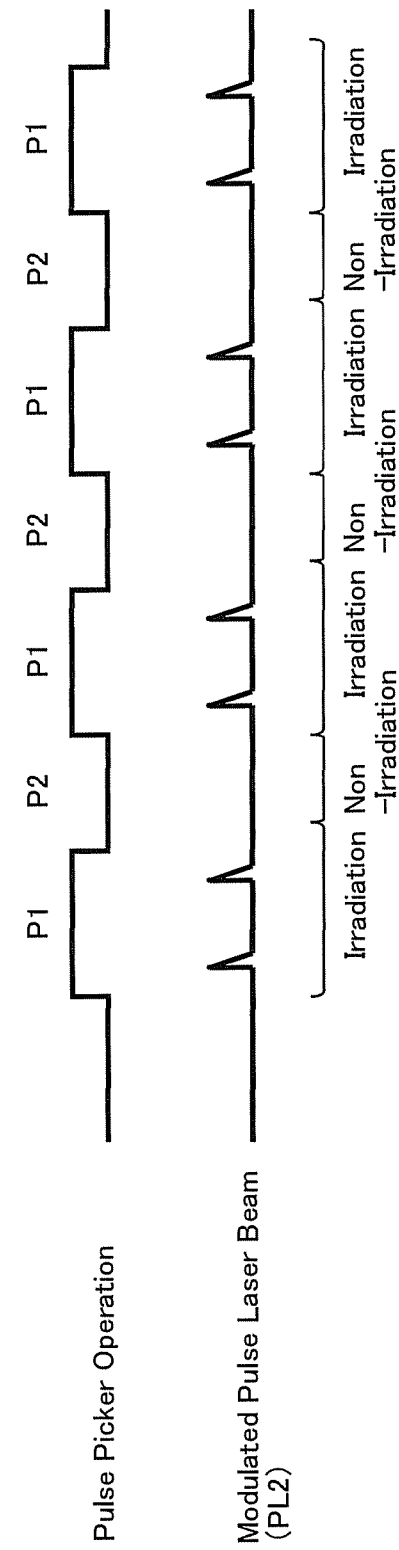
FIG. 9 is a view illustrating a pulse picker operation of the laser dicing method and a timing of a modulated pulse laser beam PL2 according to the embodiment.

FIG. 9 is a view illustrating a pulse picker operation of the laser dicing method and a timing of the modulated pulse laser beam PL2 according to the embodiment. The pulse picker operation is switched in light pulse units in synchronization with the clock signal S1. Thus, by synchronizing oscillation of the pulse laser beam and the pulse picker operation with the same clock signal S1, it is possible to realize an irradiation pattern in the light pulse units.

More specifically, irradiation and non-irradiation of the pulse laser beam are performed based on a predetermined condition defined by the light pulse number. That is, the pulse picker operation is executed based on an irradiation light, pulse number (P1) and a non-irradiation light pulse number (P2), and irradiation and non-irradiation on the work piece are switched. The P1 value and the P2 value defined by the irradiation pattern of the pulse laser beam are, for example, defined as an irradiation area register setting and a non-irradiation register setting in the process table. The P1 value and the P2 value are set to a predetermined condition of optimizing formation of the crack in the crack forming step based on a material of the work piece and a condition of a laser beam condition.

The modulated pulse laser beam PL2 is shaped into a pulse laser beam PL3 of a desired shape by the beam shaper 16. Further, the shaped pulse laser beam PL3 is condensed by the condenser lens 18 and becomes the pulse laser beam PL4 having a desired beam diameter, and is radiated on the wafer which is the work piece.

When the wafer is diced in the X axis direction and in the Y axis direction, for example, the XYZ stage is moved at a fixed speed in the Y axis direction, and the pulse laser beam PL4 is scanned. Further, after desired dicing in the Y axis direction is finished, the XYZ stage is moved at a fixed speed in the X axis direction, and the pulse laser beam PL4 is scanned. By this means, dicing in the X axis direction is performed.

An interval between irradiation and non-irradiation of a pulse laser beam is controlled based on the irradiation light pulse number (P1), the non-irradiation light pulse number (P2) and the stage speed.

In the Z axis direction (height direction), the light condensing position (focus position) of the condenser lens is adjusted to the position of a predetermined depth inside and outside the wafer. This predetermined depth is set such that, in the crack forming step, the crack is formed into a desired shape in the work piece surface.

In this case,
when a refractive index of the work piece: n
a process position from the work piece surface: L
and the Z axis movement distance: Lz
hold,
Lz=L/n
holds. That is, when the surface of the work piece is a Z axis initial position, the light condensing position of the condenser lens is processed at a position of a depth "L" from the substrate surface, the Z axis only needs to move by "Lz".

Figure 10:
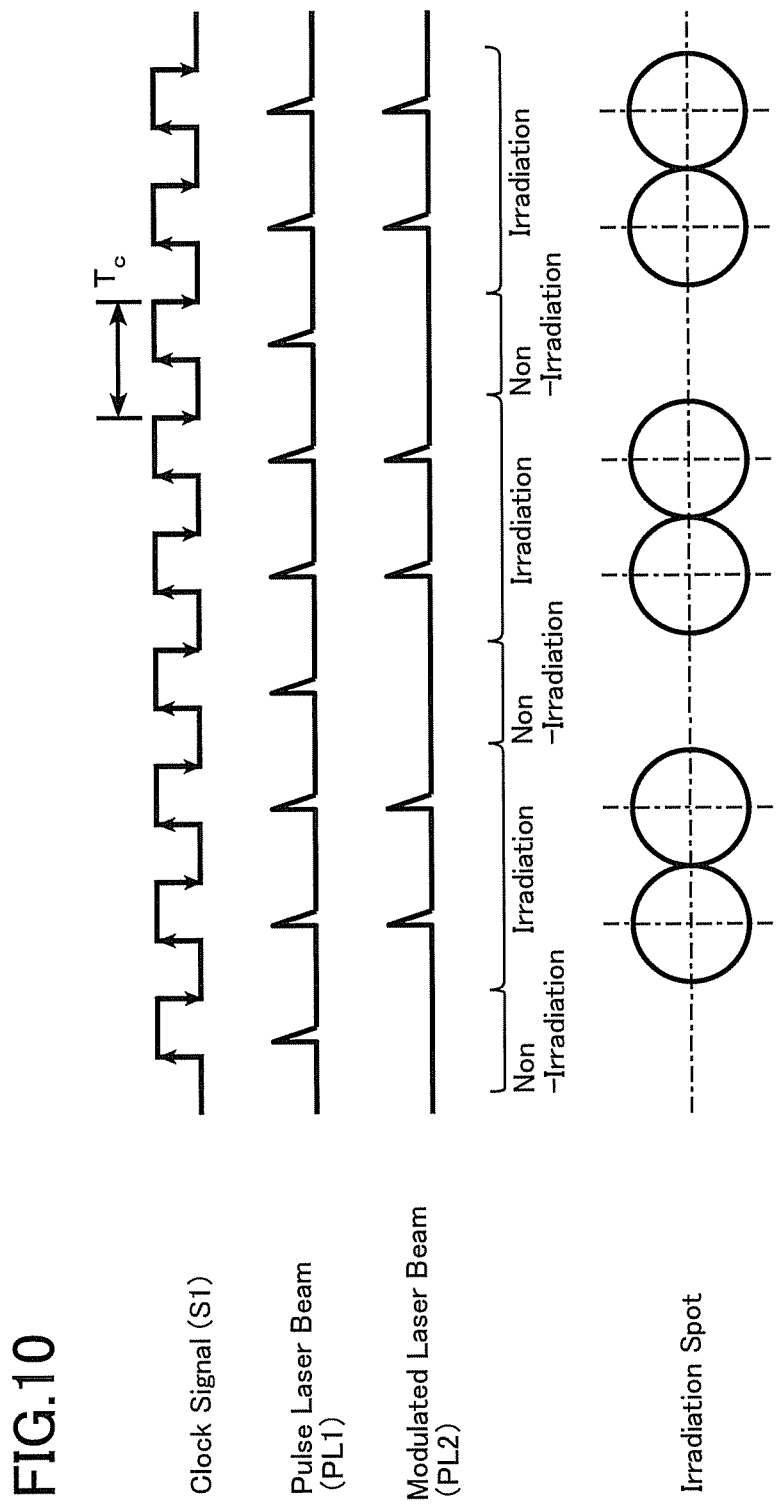
FIG. 10 is an explanatory view of an irradiation pattern of the laser dicing method according to the embodiment.

FIG. 10 is an explanatory view of an irradiation pattern of the laser dicing method according to the embodiment. As illustrated, the pulse laser beam PL1 is generated in synchronization with the clock signal S1. Further, by controlling passing and blocking of the pulse laser beam in synchronization with the clock signal S1, the modulated pulse laser beam PL2 is generated.

Furthermore, by moving the stage in the horizontal direction (the X axis direction or the Y axis direction), the irradiation light pulse of the modulated pulse laser beam PL2 is formed as an irradiation spot on the wafer. Thus, by generating the modulated pulse laser beam PL2, the irradiation spot is controlled in the light pulse units and intermittently radiated on the wafer. In case of FIG. 10, a condition that the irradiation light pulse number (P1)=2 and the non-irradiation light pulse number (P2)=1 are set, and the irradiation light pulse (Gaussian light) repeats irradiation and non-irradiation at a pitch of the spot diameter is set.

Meanwhile,
process is performed under a condition of a beam spot diameter: D (μm)

and a repetition frequency: F (KHz),
a stage movement speed V (m/sec) for repeating irradiation and non-irradiation of an irradiation light pulse at a pitch of a spot diameter
is $V=D \times 10^{-6} \times F \times 10^3$.
For example,
when process is performed under a process condition of the beam spot diameter: $D=2$ μm
and the repetition frequency: $F=50$ KHz,
the stage movement speed: $V=100$ mm/sec
holds.

Further, when irradiation light power is P (watt), a light pulse of irradiation pulse energy P/F per pulse is radiated on the wafer.

Parameters of the irradiation energy (irradiation light power) of the pulse laser beam, a process point depth of the pulse laser beam and the interval between irradiation and non-irradiation of the pulse laser beam are determined such that the crack is formed to be continuous in the work piece surface in the crack forming step.

In addition, a light pulse density of a pulse laser beam can be increased in the area in which the first line (L1) and the second line (L2) cross according to, for example, the following method.

The irradiation control unit 25 stores information which specifies a range of an increase in the light pulse density as the XY coordinate in the first or second crack forming steps. This information is, for example, a XY coordinate range of a cross point of the first line (L1) and the second line (L2) or the XY coordinate range including the cross point. This information is transmitted to the pulse picker control unit 24 as the irradiation control signal (S6)

The pulse picker control unit 24 controls irradiation of the pulse laser beam based on both of the process pattern signal (S2) and the irradiation control signal (S6). Further, in the first or second crack forming step, the light pulse density of the pulse laser beam is increased in the area in which the first line (L1) and the second line (L2) cross.

Figure 11:
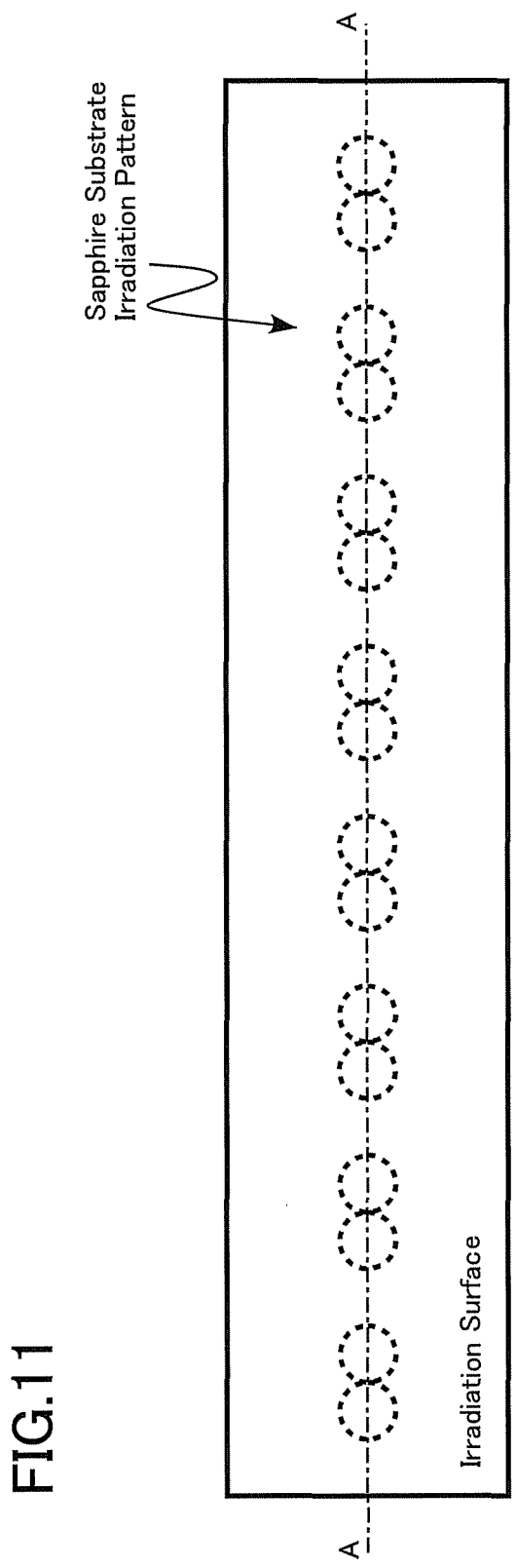
FIG. 11 is a top view illustrating an irradiation pattern radiated on a sapphire substrate in a crack forming step according to the embodiment.

FIG. 11 is a top view illustrating an irradiation pattern radiated on a sapphire substrate in the crack forming step. When a irradiation surface is seen from above, irradiation spots (circles indicated by dotted lines) are formed at a pitch of the irradiation spot diameter with the irradiation light pulse number (P1)=2 and the non-irradiation light pulse number (P2)=1.

Figure 12:
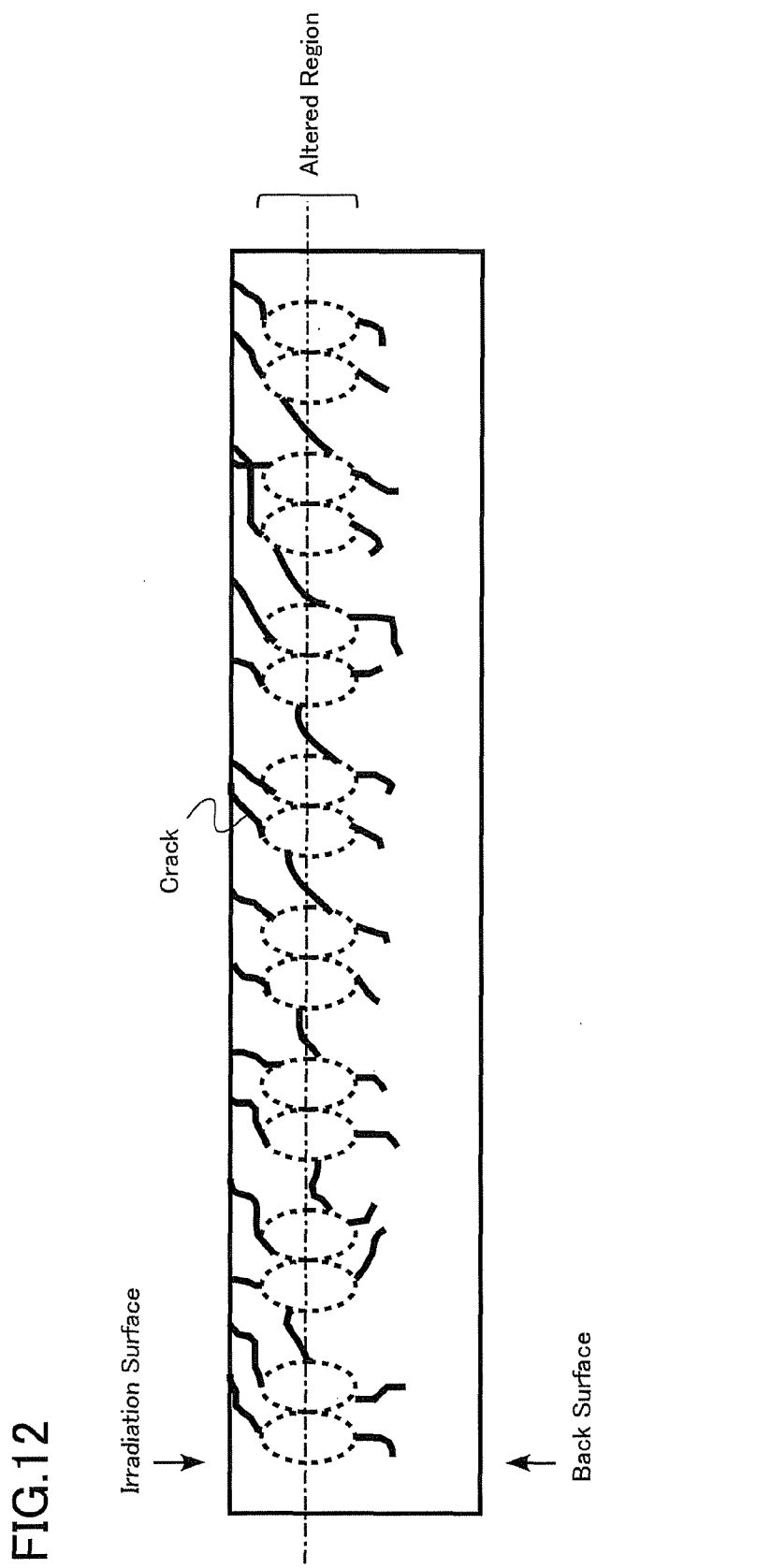
FIG. 12 is an AA cross-sectional view of FIG. 11.

FIG. 12 is an AA cross-sectional view of FIG. 11. As illustrated, an altered region is formed inside the sapphire substrate. Further, a crack (or a groove) reaching a substrate surface along a scan line of a light pulse from this altered region is formed. Furthermore, this crack is formed to be continuous in the work piece surface. In addition, in the embodiment, the crack is formed such that the crack is exposed only on the substrate surface side, and does not reach the substrate back surface side.

Figure 13:
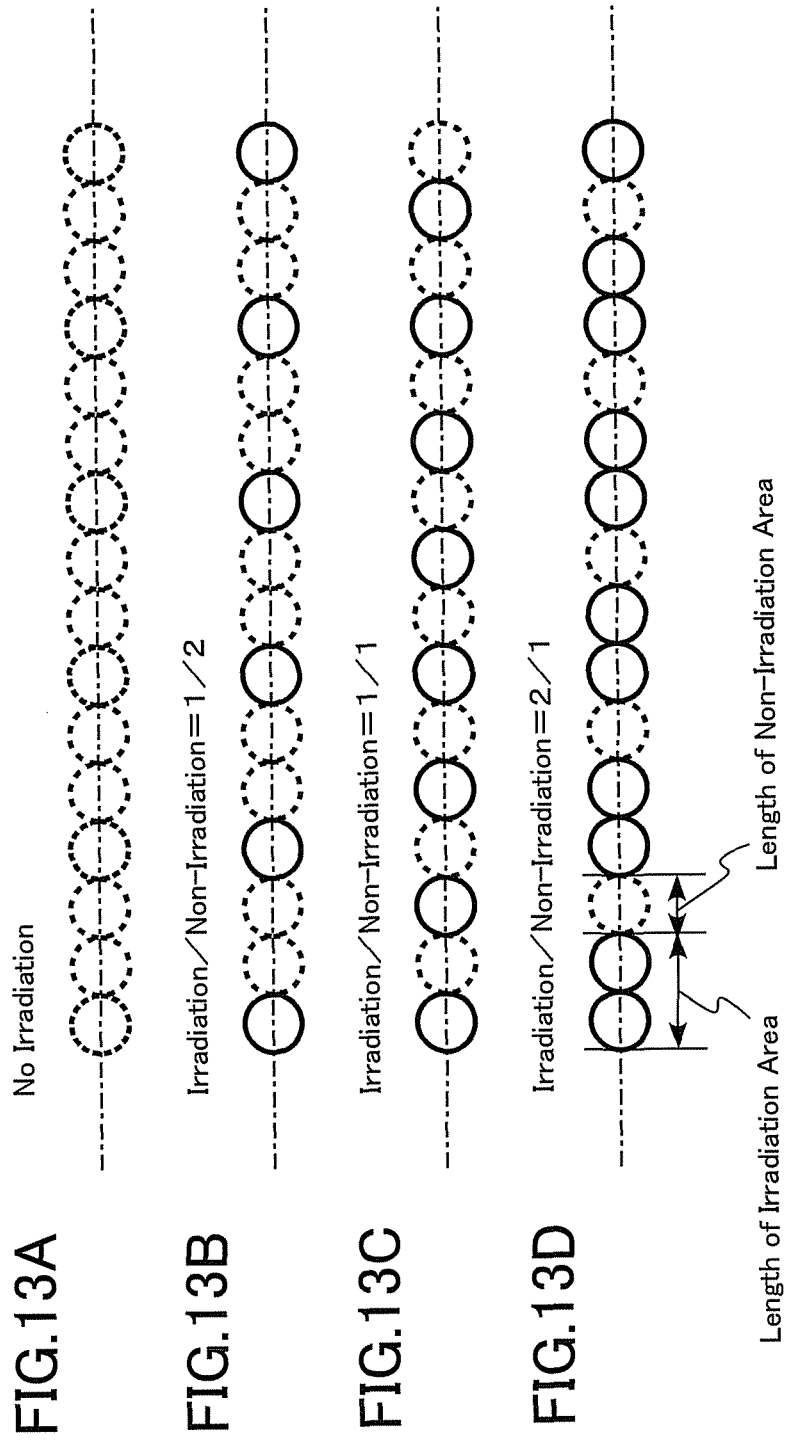
FIGS. 13A to 13D are explanatory views of a function according to the embodiment.

FIGS. 13A to 13D are explanatory views of a function according to the embodiment. For example, positions on which pulses can be radiated in case that a pulse laser is radiated at a maximum laser frequency of a pulse laser beam which can be set and at a maximum stage speed which can be set are indicated by dotted line circles in FIG. 13A. FIG. 13B illustrates an irradiation pattern in case of irradiation/non-irradiation=1/2. Solid line circles are irradiation positions, and dotted line circles are non-irradiation positions.

Meanwhile, making an interval between irradiation spots (a length of a non-irradiation area) shorter is assumed to provide good cutting performance. In this case, as illustrated in FIG. 13C, irradiation/non-irradiation=1/1 can be set without changing the stage speed. If the stage speed needs to be decreased to cause the same condition when a pulse picker is not used as in the embodiment, there is a problem of a decrease in throughput of dicing process.

Meanwhile, making longer the length of the irradiation area by making the irradiation spot continuous is assumed to provide good cutting performance. In this case, as illustrated in FIG. 13D, irradiation/non-irradiation=2/1 can be set without changing the stage speed. If the stage speed needs to be decreased and the stage speed needs to be fluctuated to provide the same condition when a pulse picker is not used as in the embodiment, there is a problem of a decrease in throughput of dicing process and significant difficulty in control.

Alternatively, although, when the pulse picker is not used, a condition similar to that of FIG. 13D can be provided by increasing irradiation energy according to the irradiation pattern in FIG. 13B, in this case, laser power concentrating on one point increases, and there is a concern of an increase in a crack width and deterioration of linearity of a crack. Further, when a work piece in which LED devices are formed on a sapphire substrate is processed, there is a concern that the amount of laser reaching an LED area on a side opposite to a crack increases and the LED devices deteriorate.

Thus, according to the embodiment, it is possible to realize various cutting conditions without changing a pulse laser beam condition or a stage speed condition, and find an optimal cutting condition without deteriorating productivity and device performance.

In addition, in the description, "the length of the irradiation area" and "the length of the non-irradiation area" refer to lengths illustrated in FIG. 13D.

Figure 14:
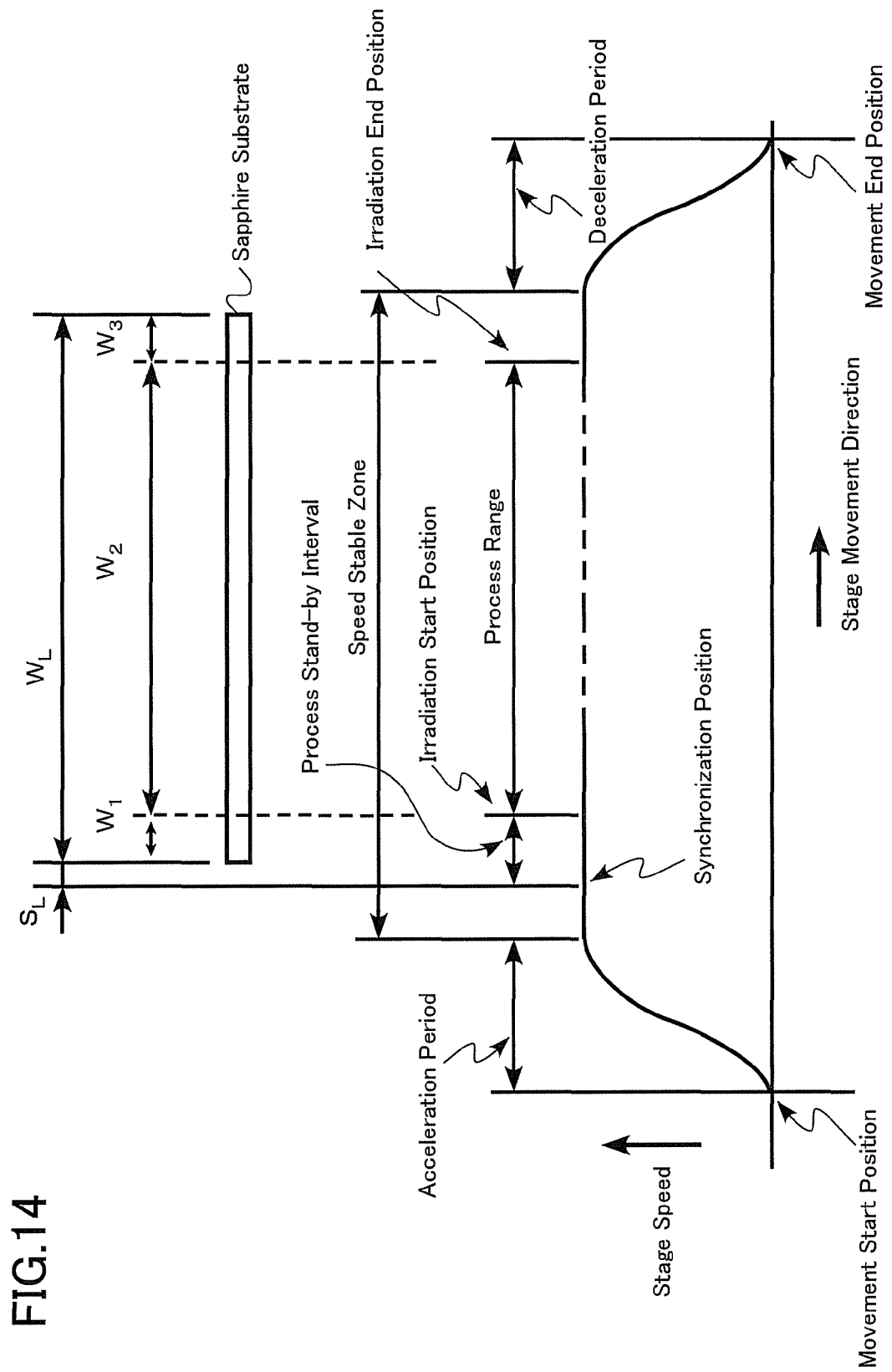
FIG. 14 is a view for explaining a relationship between stage movement and dicing process according to the embodiment.

FIG. 14 is a view for explaining a relationship between stage movement and dicing process. The XYZ stage is provided with a position sensor which detects in movement positions in the X axis and Y axis directions. For example, after the stage starts moving in the X axis or Y axis direction, a position at which the stage speed enters a speed stable zone is set as a synchronization position. Further, when the synchronization position is detected by the position sensor, a movement position detection signal S4 (FIG. 1) is outputted to the pulse picker control unit 24 to allow a pulse picker operation and operate the pulse picker according to the pulse picker drive signal S3. The synchronization position is, for example, an end surface of the work piece, and this end surface is detected by the position sensor.

Thus,
$S_L$: a distance from the synchronization position to the substrate,
$W_L$: process length,
$W_1$: a distance from a substrate end to a irradiation start position,
$W_2$: a process range,
and $W_3$: a distance from an irradiation end position to the substrate end
are managed.

Thus, the position of the stage, the position of the work piece set on the stage and an operation start position of the pulse picker are synchronized. That is, irradiation and non-irradiation of the pulse laser beam are synchronized with the position of the stage. Hence, upon irradiation and non-irradiation of the pulse laser beam, that the stage moves at a fixed speed (speed stable zone) is secured. Consequently, it is possible to secure regularity of an irradiation spot position and realize stable formation of a crack.

Meanwhile, when a thick substrate is processed, cutting performance is improved by scanning an identical scan line of a plurality of (a plurality of layers of) substrates by means of pulse laser beams of different process point depths, and forming a crack. In this case, by synchronizing the stage position and the operation start position of the pulse picker, it is possible to arbitrarily and precisely control a relationship between pulse irradiation positions upon scan at different depths, and optimize the dicing condition.

Further, synchronizing movement of a stage with a clock signal is preferable to further improve precision of an irradiation spot position. This can be realized by, for example, synchronizing with the clock signal S1 the stage movement signal S5 (FIG. 1) outputted from the process control unit 26 to the XYZ stage unit 20.

Like the laser dicing method according to the embodiment, by forming a crack which reaches a substrate surface and which is continuous in the work piece surface, cutting a substrate becomes easy. Even when, for example, a substrate is a hard substrate like a sapphire substrate, by artificially applying a force at a point of time when a crack reaching the substrate surface is cut or fractured, it is possible to easily perform cutting and realize good cutting performance. Consequently, productivity of dicing improves.

A method of continuously irradiating a pulse laser beam on a substrate in the crack forming step has difficulty in controlling the crack which is formed to be continuous in the substrate surface, into a desired shape even if a stage movement speed, a numerical aperture of the condenser lens an irradiation power are optimized. As in the embodiment, by intermittently switching irradiation and non-irradiation of a pulse laser beam in light pulse units and optimizing an irradiation pattern, generation of a crack reaching a substrate surface is controlled and the laser dicing method which has good cutting performance is realized.

That is, for example, it is possible to form on the substrate surface a crack of a narrow width which is substantially linearly continuous along a scan line of a laser. By forming such a crack which is substantially linearly continuous, it is possible to minimize an influence of a crack on devices such as LEDs formed on a substrate upon dicing. Further, for example, it is possible to form a linear crack, and narrow the width of an area in which a crack is formed in the substrate surface. Consequently, it is possible to narrow a dicing width of design. Consequently, it is possible to increase the number of chips of devices formed on an identical substrate or a wafer, and thereby reduce manufacturing cost of the devices.

Further, the method of increasing a pulse density of a pulse laser beam can control an irradiation pattern independently from a process table stored in the process table unit 30 by using the irradiation control unit 25 as described above. Consequently, even when, for example, the arrangement pitches "a" and "b" of the LEDs 100 change, it is possible to provide an advantage of easily changing an irradiation pattern.

Naturally, for example, to simplify a configuration of the laser dicing device, the light pulse density may be increased by describing a portion at which the light pulse density of a pulse laser beam is increased, in the process table unit stored in the process table unit 30 in advance.

Hereinafter, an embodiment of this present disclosure will be described with reference to specific examples. However, the present disclosure is by no means limited to these specific examples. Although, in the embodiment, components of a laser dicing method and a laser dicing device which are not directly necessary for description of this present disclosure will not be described, the required devices related to the laser dicing method and the laser dicing device can be adequately selected and used.

In addition, all laser dicing methods which have elements of the present disclosure and which can be adequately changed by one of ordinary skill in art are incorporated in the scope of the present disclosure. The scope of the present disclosure is defined by the claims and equivalents thereof.

For example, in the embodiment, a substrate in which LEDs are formed on a sapphire substrate has been described as a work piece. Although the present disclosure is useful for a substrate which is hard like a sapphire substrate, has poor cleavage and is difficult to cut, work pieces may be substrates including a semiconductor material substrate such as a SiC (silicon carbide) substrate, a piezoelectric material substrate, a quartz substrate and a glass substrate such as quartz glass.

Further, in the embodiment, a case has been described as an example where the work piece and the pulse laser beam are relatively moved by moving the stage. However, a method of relatively moving a work piece and a pulse laser beam by, for example, using a laser beam scanner and scanning a pulse laser beam may be adopted.

Further, although a case has been described with the embodiment as an example where a irradiation light pulse number (P1)=1 and a non-irradiation light pulse number (P2)=1, and a irradiation light pulse number (P1)=2 and a non-irradiation light pulse number (P2)=1 are set in the crack forming step, values of P1 and P2 can take arbitrary values to set an optimal condition. Furthermore, although the case has been described with the embodiment as an example where an irradiation light pulse repeats irradiation and non-irradiation at a pitch of a spot diameter, it is possible to find the optimal condition while changing pitches of irradiation and non-irradiation by changing a pulse frequency or a stage movement speed. For example, it is also possible to make pitches of irradiation and non-irradiation 1/n or n times of the spot diameter.

Further, although Y direction scan is performed in the first crack forming step and X direction scan is performed in the second crack forming step, the sequence may be reversed to perform X direction scan in the first crack forming step and Y direction scan in the second crack forming step.

Particularly when a work piece is a sapphire substrate, by setting irradiation energy to 30 mW or more and 150 mW or less and setting a irradiation interval to 1 to 6 µm by allowing a pulse laser beam to pass in 1 to 4 pulse units and to be blocked in 1 to 4 light pulse units, it is possible to form a crack of good continuity and linearity in a work piece surface.

Further, by, for example, providing a plurality of irradiation area registers and non-irradiation area registers for a dicing process pattern, and changing irradiation area register and non-irradiation area register values in real time at desired timings to desired values, it is possible to support various dicing process patterns.

Furthermore, a device which has a process table unit which stores a process table in which dicing process data is described as light pulse numbers of pulse laser beams has been described as an example of a laser dicing device. However, the device does not necessarily have this process table unit, and only needs to employ a configuration of controlling passing and blocking of a pulse laser beam in a pulse picker in light pulse units.

Further, it is also possible to employ a configuration of forming which is continuous in a substrate surface, irradiating a laser on a surface and applying melting process or abrasion process to the surface to further improve cutting performance.

What is claimed is:

1. A laser dicing method which comprises: setting a work piece on a stage;
generating a clock signal;
emitting a pulse laser beam synchronized with the clock signal;

relatively moving the work piece and the pulse laser beam;

switching irradiation and non-irradiation of the pulse laser beam on the work piece in light pulse units by controlling passing and blocking of the pulse laser beam using a pulse picker in synchronization with the clock signal; and forming a crack reaching a substrate surface of the work piece to be continuous in the substrate surface of the work piece by controlling irradiation energy of the pulse laser beam, a process point depth of the pulse laser beam and lengths of an irradiation area and a non-irradiation area of the pulse laser beam, the laser dicing method comprising:

a first crack forming of irradiating the pulse laser beam on the work piece along a first line; and a second crack forming of irradiating the pulse laser beam on the work piece along a second line orthogonal to the first line, wherein, in an area in which the first line and the second line cross, a light pulse density of the pulse laser beam is increased in the first crack forming or the second crack forming.

2. The laser dicing method according to claim 1, wherein, in the first or second crack forming, a irradiation control signal which comprises information of a portion at which the light pulse density of the pulse laser beam is increased is generated, and the light pulse density in an area in which the first line and the second line cross is increased using the irradiation control signal.

3. The laser dicing method according to claim 1, wherein the crack is formed substantially linearly in the substrate surface of the work piece.

4. The laser dicing method according to claim 1, wherein a position of the work piece and an operation start position of the pulse picker are synchronized.

5. The laser dicing method according to claim 1, wherein the work piece includes a sapphire substrate, a quartz substrate or a glass substrate.

6. The laser dicing method according to claim 2, wherein the crack is formed substantially linearly in the substrate surface of the work piece.

7. The laser dicing method according to claim 2, wherein a position of the work piece and an operation start position of the pulse picker are synchronized.

8. The laser dicing method according to claim 3, wherein a position of the work piece and an operation start position of the pulse picker are synchronized.

9. The laser dicing method according to claim 6, wherein a position of the work piece and an operation start position of the pulse picker are synchronized.

10. The laser dicing method according to claim 2, wherein the work piece includes a sapphire substrate, a quartz substrate or a glass substrate.

11. The laser dicing method according to claim 3, wherein the work piece includes a sapphire substrate, a quartz substrate or a glass substrate.

12. The laser dicing method according to claim 4, wherein the work piece includes a sapphire substrate, a quartz substrate or a glass substrate.

13. The laser dicing method according to claim 6, wherein the work piece includes a sapphire substrate, a quartz substrate or a glass substrate.

14. The laser dicing method according to claim 7, wherein the work piece includes a sapphire substrate, a quartz substrate or a glass substrate.

15. The laser dicing method according to claim 8, wherein the work piece includes a sapphire substrate, a quartz substrate or a glass substrate.

16. The laser dicing method according to claim 9, wherein the work piece includes a sapphire substrate, a quartz substrate or a glass substrate.

* * * * *